(12) United States Patent
Xu et al.

(10) Patent No.: US 10,199,236 B2
(45) Date of Patent: Feb. 5, 2019

(54) THIN FILM TRANSISTOR, MANUFACTURING METHOD THEREOF, AND METHOD FOR MANUFACTURING ARRAY SUBSTRATE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Dezhi Xu, Beijing (CN); Xianxue Duan, Beijing (CN); Kui Gong, Beijing (CN)

(73) Assignees: BOE TECHNOLOGY GROUP CO., LTD. (CN); HEFEI BOE OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 15/843,796

(22) Filed: Dec. 15, 2017

(65) Prior Publication Data
US 2018/0315619 A1 Nov. 1, 2018

(30) Foreign Application Priority Data
Apr. 28, 2017 (CN) .......................... 2017 1 0300075

(51) Int. Cl.
*H01L 21/467* (2006.01)
*H01L 29/66* (2006.01)
*H01L 21/308* (2006.01)
*H01L 29/786* (2006.01)
*H01L 27/32* (2006.01)
*H01L 27/12* (2006.01)

(52) U.S. Cl.
CPC ........ *H01L 21/467* (2013.01); *H01L 21/3086* (2013.01); *H01L 29/66969* (2013.01); *H01L 29/7869* (2013.01); *H01L 29/78693* (2013.01); *H01L 27/1225* (2013.01); *H01L 27/3262* (2013.01)

(58) Field of Classification Search
CPC ............... H01L 21/467; H01L 21/3086; H01L 29/78693; H01L 29/7869; H01L 29/66969; H01L 27/1225; H01L 27/3262
See application file for complete search history.

(56) References Cited

U.S. PATENT DOCUMENTS 5,075,240 A * 12/1991 Yama .................... H01L 21/266
257/E21.346
2016/0268537 A1 * 9/2016 Ma ...................... H01L 27/3244

* cited by examiner

*Primary Examiner* — Yosef Gebreyesus
(74) *Attorney, Agent, or Firm* — Brooks Kushman P.C.

(57) ABSTRACT

A thin film transistor, a manufacturing method thereof, and a method for manufacturing an array substrate are provided. The method for manufacturing the thin film transistor includes: forming an active layer film on a base; and forming a source electrode and a drain electrode of the thin film transistor using a conductive photoresist.

20 Claims, 4 Drawing Sheets

THIN FILM TRANSISTOR, MANUFACTURING METHOD THEREOF, AND METHOD FOR MANUFACTURING ARRAY SUBSTRATE

CROSS-REFERENCE TO RELATED APPLICATION

This application claims priority to Chinese Patent Application No. 201710300075.5 filed on Apr. 28, 2017, which is incorporated herein by reference in its entirety.

TECHNICAL FIELD

The present disclosure relates to the field of display technology, in particular to a thin film transistor (TFT), a manufacturing method thereof, and a method for manufacturing an array substrate.

BACKGROUND

Along with the development of the information technology, higher demands, e.g., high resolution, large brightness value, small response time and low power consumption, have been set on a display product. These demands may be met through a TFT having an active layer made of a transparent metal oxide. Hence, the application of a transparent metallic oxide material to a next-generation liquid crystal display (LCD) and an organic light-emitting diode (OLED) display device has attracted more and more attentions.

In the related art, in the case of manufacturing an oxide TFT, an active layer of the oxide TFT is made of a metal oxide, so its stability is susceptible to oxygen, hydrogen and water in a wet-etching environment. Currently, in most of the time, a signal line and a source/drain electrode are each made of a composite material consisting of copper and its barrier metal, and an etchant includes hydrogen peroxide as a principal component. In this way, it is able to prevent the active layer made of the metal oxide from being etched.

SUMMARY

In one aspect, the present disclosure provides in some embodiments a method for manufacturing a TFT, including steps of: forming an active layer film on a base; and forming a source electrode and a drain electrode of the TFT using conductive photoresist.

In a possible embodiment of the present disclosure, subsequent to the step of forming the active layer film and prior to the step of forming the source electrode and the drain electrode, the method further includes: forming a pattern of an active layer on the base through a patterning process.

In a possible embodiment of the present disclosure, the step of forming the source electrode and the drain electrode of the TFT using the conductive photoresist includes: applying a conductive photoresist film onto the base on which the pattern of the active layer has been formed; pre-curing the conductive photoresist film; exposing and developing the conductive photoresist film, to form a pattern of the source electrode and the drain electrode; and post-curing the source electrode and the drain electrode.

In a possible embodiment of the present disclosure, the step of forming the source electrode and the drain electrode of the TFT using the conductive photoresist includes: applying a conductive photoresist film onto the base on which the active layer film has been formed; pre-curing the conductive photoresist film; subjecting the conductive photoresist film to a patterning process, to remove a portion of the conductive photoresist film at a region other than a region corresponding to a pattern of the active layer, partially reserve a portion of the conductive photoresist film at a region corresponding to a channel in the active layer, and reserve a portion of the conductive photoresist film at a region corresponding to the pattern of the source electrode and the drain electrode; forming the pattern of the active layer through a wet-etching process; and removing the portion of the conductive photoresist film at the region corresponding to the channel in the active layer through a dry-etching process, and thinning the portion of the conductive photoresist film at the region corresponding to the pattern of the source electrode and the drain electrode, to form the pattern of the source electrode and the drain electrode.

In a possible embodiment of the present disclosure, the step of applying the conductive photoresist film includes: applying the conductive photoresist film onto the base in a slit-coating manner or a spin-coating manner, to form the conductive photoresist film with a thickness of 0.2 μm to 2.0 μm on the base.

In a possible embodiment of the present disclosure, the conductive photoresist film is pre-cured at a temperature of 100° C. to 110° C. for 50 seconds to 80 seconds.

In a possible embodiment of the present disclosure, the source electrode and the drain electrode are post-cured at a temperature of 110° C. to 120° C. for 50 seconds to 80 seconds.

In a possible embodiment of the present disclosure, the source electrode and the drain electrode are post-cured at a temperature of 120° C. for 60 seconds.

In a possible embodiment of the present disclosure, the conductive photoresist includes a conductive medium, film-forming resin, a photosensitizer, a solvent and a supplement.

In a possible embodiment of the present disclosure, the conductive medium is made of metal conductive particles or alloy conductive particles having resistivity smaller than $10*10^{-8}$ Ω·m, or graphene; the film-forming resin is thermoplastic resin; and the photosensitizer is made of an aromatic ketone derivative or a benzoin ether derivative.

In a possible embodiment of the present disclosure, the active layer is made of a polycrystalline metal oxide semiconductor material or an amorphous metal oxide semiconductor material.

In a possible embodiment of the present disclosure, subsequent to or prior to the steps of forming the active layer, the source electrode and the drain electrode, the method further includes: forming a gate electrode and a gate insulation layer of the TFT sequentially on the base.

In a possible embodiment of the present disclosure, the conductive photoresist is transparent conductive photoresist, and the conductive photoresist film is transparent conductive photoresist film.

In another aspect, the present disclosure provides in some embodiments a method for manufacturing an array substrate, including a step of forming a TFT manufactured by the above-mentioned method on a base.

In a possible embodiment of the present disclosure, the method further includes: forming a data line using the conductive photoresist, the data line being formed together with a source electrode and a drain electrode of the TFT through a single patterning process; and forming, through patterning processes, a pixel electrode, a passivation layer and a common electrode sequentially on the base on which the TFT has been formed.

In a possible embodiment of the present disclosure, the conductive photoresist is transparent conductive photoresist.

In yet another aspect, the present disclosure provides in some embodiments a TFT, including an active layer; a source electrode; and a drain electrode, wherein the source electrode and the drain electrode are arranged on the active layer and made of a conductive photoresist.

In a possible embodiment of the present disclosure, the TFT further includes a gate electrode and a gate insulation layer. The gate electrode is arranged between the base and the active layer and the gate insulation layer is arranged between the gate electrode and the active layer, or the gate insulation layer and the gate electrode are sequentially arranged on the source electrode and the drain electrode.

In a possible embodiment of the present disclosure, the source electrode and the drain electrode are arranged at an identical layer and at two sides of the active layer respectively.

In a possible embodiment of the present disclosure, the conductive photoresist is transparent conductive photoresist.

BRIEF DESCRIPTION OF THE DRAWINGS

In order to illustrate the technical solutions of the present disclosure in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

Figure 1:
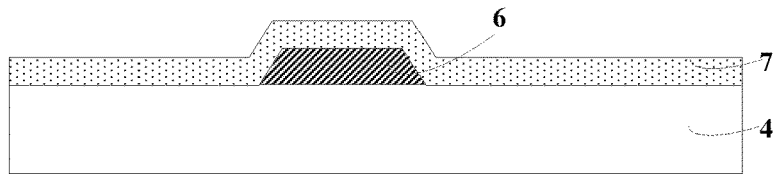
FIG. 1 is a schematic view showing the formation of a gate electrode and a gate insulation layer according to some embodiments of the present disclosure.

REFERENCE SIGN LIST 1 active layer
101 channel
2 source electrode
3 drain electrode
4 base
5 transparent conductive photoresist film
6 gate electrode
7 gate insulation layer
8 active layer film
9 pixel electrode
10 passivation layer
11 common electrode
12 TFT
13 data line

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the case that a relatively mature copper process in the related art is used, there still exist the following problems for a Back Channel Etched (BCE)-type technique. Due to a wet-etching process, the active layer, especially a channel in the active layer, may be damaged greatly due to the water, and thereby electrical properties of the TFT may be adversely affected. In addition, it is impossible for the BCE-type technique to really reflect the advantages of the active layer made of a metal oxide semiconductor material in reducing the power consumption of the display device.

Hence, there is an urgent need to find a way to prevent the active layer made of the transparent metal oxide from being damaged by the wet-etching process during the manufacture of the TFT.

The present disclosure provides in some embodiments a method for manufacturing a TFT which, as shown in FIGS. 1 to 5, includes steps of forming an active layer film onto a base 4; and forming a source electrode 2 and a drain electrode 3 of the TFT using a transparent conductive photoresist.

According to the embodiments of the present disclosure, the source electrode 2 and the drain electrode 3 of the TFT are formed using the transparent conductive photoresist, and as compared with the related art where the source electrode and the drain electrode are made of a metal material, it is able to form the source electrode 2 and the drain electrode 3 without a wet-etching process and a removing process, thereby to prevent the active layer 1 made of a metal oxide material from being damaged by water in the wet-etching process and the removing process, and ensure the electrical properties of the TFT with the active layer 1 made of the metal oxide layer. In addition, the source electrode 2 and the drain electrode 3 are transparent, so it is able to increase an aperture ratio of a pixel unit of an array substrate using the TFT, thereby to reduce the power consumption of a backlight source of a display device using the TFT.

In the embodiments of the present disclosure, subsequent to the step of forming the active layer film and prior to the step of forming the source electrode 2 and the drain electrode 3, the method further includes forming a pattern of an active layer 1 on the base 4 through a patterning process.

Figure 2:
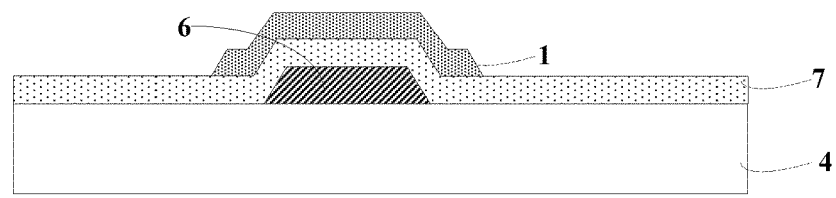
FIG. 2 is a schematic view showing the formation of an active layer according to some embodiments of the present disclosure.

The active layer film made of a metal oxide may be formed through sputtering or thermal evaporation, and the active layer film may have a thickness within the range of approximate 30 nm to 80 nm. Next, the specific pattern of the active layer 1 may be formed through a patterning process (as shown in FIG. 2). The patterning process includes steps of applying, exposing, developing, and etching a photoresist, which will not be particularly defined herein.

In the embodiments of the present disclosure, as shown in FIGS. 2 to 5, the step of forming the source electrode and the drain electrode of the TFT using the transparent conductive photoresist includes the following steps.

Figure 3:
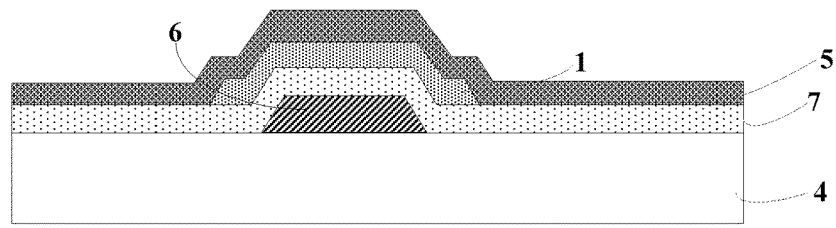
FIG. 3 is a schematic view showing the application of a transparent conductive photoresist film according to some embodiments of the present disclosure.

Step S10: applying a transparent conductive photoresist film 5 onto the base 4 with the pattern of the active layer 1 (as shown in FIGS. 2 and 3). In this step, applying the transparent conductive photoresist film 5 includes applying the transparent conductive photoresist film 5 at a thickness of 0.2 μm to 2.0 μm onto the base 4 through slit-coating or spin-coating.

The transparent conductive photoresist includes a conductive medium, film-forming resin, a photosensitizer, a solvent and a supplement. The conductive medium is made of metal conductive particles or alloy conductive particles having resistivity smaller than $10*10^{-8}$ Ω·m, or grapheme. Graphene has many excellent properties, such as a high theoretical specific surface area (2630 m$^2$/g), excellent thermal conductivity (5000 W/m·K), high strength (130 GPa), a high modulus (1060 GPa), high electron mobility at a room temperature (15000 cm$^2$/Vs, 100 times that of silicon), and high conductivity (7200 S/cm). Due to the excellent conductivity and electron mobility, graphene, even at a small amount, may be introduced into a polymer so as to acquire a conductive high-molecule material with permanent, high conductivity and low cost. The film-forming resin is thermoplastic resin, and the photosensitizer is made of an aromatic ketone derivative or a benzoin ether derivative. The solvent may be a volatile solvent, e.g., one or two of a cyclic ester solvent, a ketone solvent and an ether solvent. The supplement includes a plasticizer, an adhesion promoter and a surfactant, so as to improve the coating characteristic of the transparent conductive photoresist onto the base as well as the stability of the patterns.

In addition, the active layer 1 may be made of a polycrystalline metal oxide semiconductor material or an amorphous metal oxide semiconductor material. For example, the active layer 1 may be made of indium gallium zinc oxide (IGZO), indium tin zinc oxide (ITZO), indium zinc oxide (IZO), $In_2O_3$, $TiO_2$ or another metal oxide.

Step S11: pre-curing the transparent conductive photoresist film 5.

In this step, the transparent conductive photoresist film is pre-cured at a temperature of 100° C. to 110° C. for 50 seconds to 80 seconds.

Figure 4:
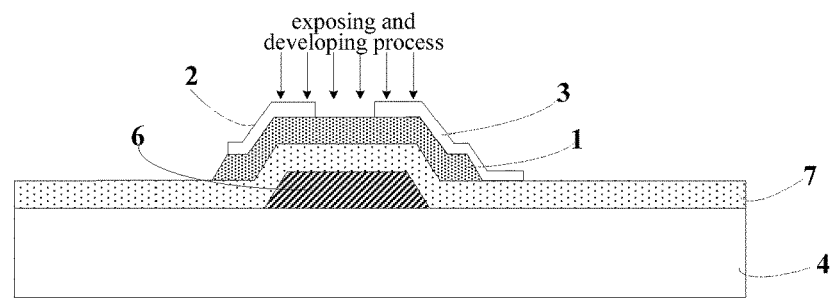
FIG. 4 is a schematic view showing the exposing and developing of the transparent conductive photoresist film according to some embodiments of the present disclosure.

Step S12: exposing and developing the transparent conductive photoresist film 5, so as to form a pattern of the source electrode 2 and the drain electrode 3 (as shown in FIG. 4).

In this step, the transparent conductive photoresist film 5 may be exposed using a mask plate in such a manner that a portion of the transparent conductive photoresist film at a position corresponding to the source electrode 2 and the drain electrode 3 is not exposed while the remaining transparent conductive photoresist film is exposed. After the exposure, the transparent conductive photoresist film may be developed, so as to form the pattern of the source electrode 2 and the drain electrode 3.

Figure 5:
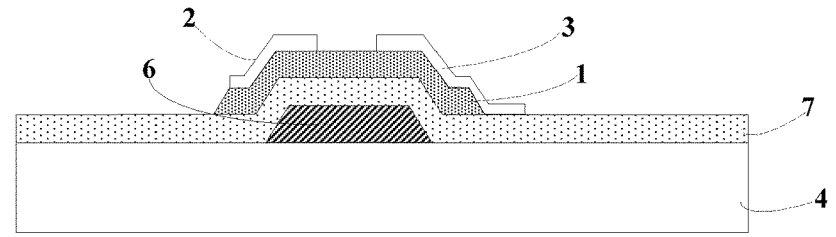
FIG. 5 is a schematic view showing the formation of a pattern of a source electrode and a drain electrode through curing according to some embodiments of the present disclosure.

Step S13: post-curing the source electrode 2 and the drain electrode 3 (as shown in FIG. 5).

In this step, the developed pattern of the source electrode 2 and the drain electrode 3 may be post-cured and checked. The pattern of the source electrode 2 and the drain electrode 3 may be post-cured at a temperature of 110° C. to 120° C. for 50 seconds to 80 seconds. In a possible embodiment of the present disclosure, the pattern of the source electrode and the drain electrode may be post-cured at a temperature of 120° C. for 60 seconds, so as to finally form the pattern of the source electrode 2 and the drain electrode 3.

In the embodiments of the present disclosure, prior to the steps of forming the active layer 1, the source electrode 2 and the drain electrode 3, the method further includes a step S09 of forming a gate electrode 6 and a gate insulation layer 7 of the TFT sequentially on the base 4 (as shown in FIG. 1).

In the embodiments of the present disclosure, the TFT is a bottom-gate TFT, and the gate electrode 6 and the gate insulation layer 7 may be formed through a patterning process (including the steps of applying, exposing, developing and etching) in the related art, which will not be particularly defined herein.

It should be appreciated that, in a possible embodiment of the present disclosure, the gate electrode and the gate insulation layer of the TFT may be formed sequentially on the base subsequent to the steps of forming the active layer, the source electrode and the drain electrode, and at this time, the TFT may be a top-gate TFT.

Based on an identical inventive concept, the present disclosure further provides in some embodiments the TFT manufactured by the above-mentioned method. As shown in FIG. 5, the TFT includes the active layer 1, the source electrode 2 and the drain electrode 3. The source electrode 2 and the drain electrode 3 are arranged in an identical layer above the active layer 1 and at two sides of the active layer 1 respectively. The active layer 1 is made of a metal oxide material, and the source electrode 2 and the drain electrode 3 are each made of a transparent conductive photoresist material.

The TFT further includes the gate electrode 6 and the gate insulation layer 7. The gate electrode 6 is arranged between the base 4 and the active layer 1, and the gate insulation layer 7 is arranged between the gate electrode 6 and the active layer 1. At this time, the TFT may be a bottom-gate TFT.

It should be appreciated that, alternatively, the gate insulation layer and the gate electrode may also be sequentially arranged on the source electrode and the drain electrode, and at this time, the TFT is a top-gate TFT.

As shown in FIGS. 6 to 9, the present disclosure further provides in some embodiments another method for manufacturing the TFT. Different from the method in FIGS. 1 to 5, in this method, the step of forming the source electrode 2 and the drain electrode 3 of the TFT using the transparent conductive photoresist may include the following steps.

Figure 6:
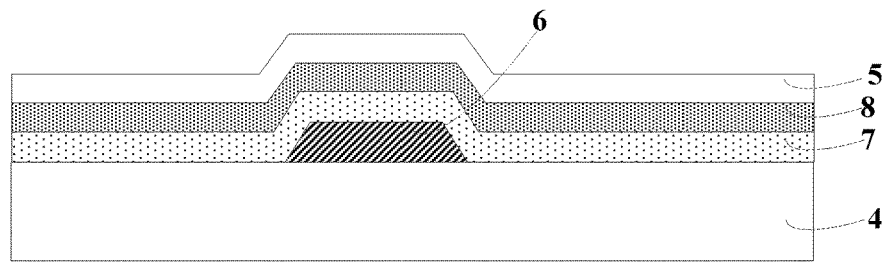
FIG. 6 is a schematic view showing the application of the transparent conductive photoresist film onto an active layer film according to some embodiments of the present disclosure.

Step S20: applying a transparent conductive photoresist film 5 onto the base 4 with the active layer film 8 (as shown in FIG. 6).

The active layer film 8 may be formed through sputtering or thermal evaporation, and it may have a thickness within the range of approximately 30 nm to 80 nm. The active layer film 8 may be made of IGZO, ITZO, IZO, $In_2O_3$, $TiO_2$ or another metal oxide. The transparent conductive photoresist film 5 at a thickness of 0.2 μm to 2.0 μm may be applied in a slit-coating manner or a spin-coating manner.

Step S21: pre-curing the transparent conductive photoresist film 5. In this step, the pre-curing process of the transparent conductive photoresist film 5 and the parameters thereof may refer to the embodiments as shown in FIGS. 1 to 5.

Figure 7:
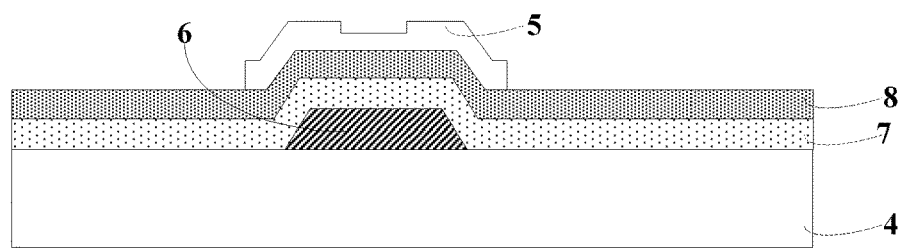
FIG. 7 is a schematic view showing a situation after subjecting the transparent conductive photoresist film to a patterning process according to some embodiments of the present disclosure.

Step S22: subjecting the transparent conductive photoresist film 5 to a patterning process, so as to remove a portion of the transparent conductive photoresist film 5 at a region other than a region corresponding to a pattern of the active layer 1, partially reserve a portion of the transparent conductive photoresist film 5 at a region corresponding to a channel 101 in the active layer 1, and reserve a portion of the transparent conductive photoresist film 5 at a region corresponding to the pattern of the source electrode 2 and the drain electrode 3 (as shown in FIG. 7). The patterning process includes steps of applying, exposing, developing, and etching a photoresist, which will not be particularly defined herein.

The channel 101 is formed in the active layer 1 in the case that the TFT is turned on, and the channel 101 corresponds to a portion of the active layer 1 between the source electrode 2 and the drain electrode 3.

Figure 8:
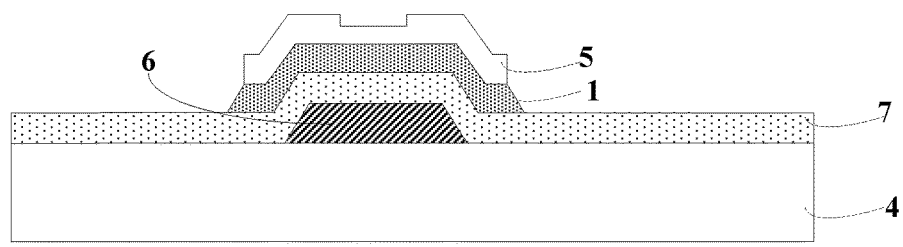
FIG. 8 is a schematic view showing the formation of a pattern of the active layer through a wet-etching process according to some embodiments of the present disclosure.

Step S23: forming the pattern of the active layer 1 through a wet-etching process (a shown in FIG. 8).

Figure 9:
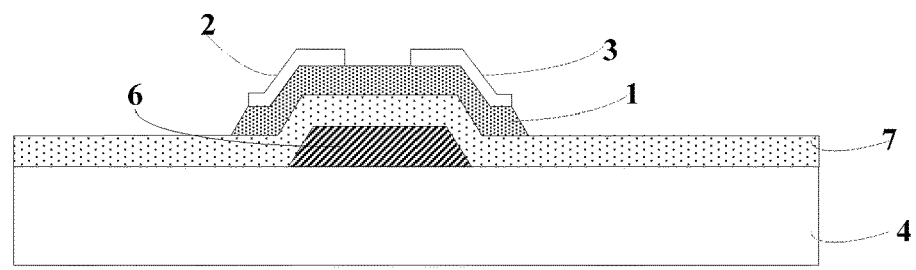
FIG. 9 is a schematic view showing the formation the pattern of the source electrode and the drain electrode through removing a portion of the transparent conductive photoresist film at a region corresponding to a channel in the active layer and thinning a portion of the transparent conductive photoresist film at a region corresponding to the patterns of the source electrode and the drain electrode through an ashing process according to some embodiments of the present disclosure.

Step S24: removing the portion of the transparent conductive photoresist film 5 at the region corresponding to the channel 101 in the active layer 1 through a dry-etching process, and thinning the portion of the transparent conductive photoresist film 5 at the region corresponding to the pattern of the source electrode 2 and the drain electrode 3, so as to form the pattern of the source electrode 2 and the drain electrode 3 (as shown in FIG. 9).

In this step, the exposed portion of the transparent conductive photoresist film 5 at the region corresponding to the channel 101 in the active layer 1 may be subjected to ashing treatment in a dry-etching process, so as to thin the entire transparent conductive photoresist film 5 and remove the portion of the transparent conductive photoresist film 5 at the region corresponding to the channel 101 in the active layer 1, thereby to acquire the complete pattern of the source electrode 2 and the drain electrode 3.

According to the method in the embodiments of the present disclosure, the photoresist doped with the conductive medium is used to, on one hand, form the pattern of the active layer 1, and on the other hand, serve as the material of the source electrode 2 and the drain electrode 3. In this way, it is able to reduce the number of etching processes for forming the source electrode 2 and the drain electrode 3, thereby to prevent the active layer 1 made of the metal oxide from being damaged by the water used in the etching processes. In addition, as compared with the method in FIGS. 1 to 5, it is able to omit a mask process during the formation of the pattern of the active layer 1, so as to protect the active layer 1 and prevent the active layer 1, especially the channel 101 in the active layer 1, from being subjected to and damaged by the wet-etching process, thereby to ensure the electrical properties of the TFT 1 with the active layer 1 made of the metal oxide. Furthermore, the source electrode 2 and the drain electrode 3 are made of the transparent conductive photoresist, so it is able to remarkably increase an aperture ratio of a pixel unit of an array substrate using the TFT, thereby to reduce the power consumption of a backlight source of a display device using the TFT.

In addition, the method in the embodiments of the present disclosure may be applied to the manufacture of a top-gate TFT and a bottom-gate TFT. During the manufacture, it is unnecessary to form the etch stop layer above the active layer 1 as that in the related art, so it is able to omit a manufacture process for forming the etch stop layer, thereby to improve the production efficiency and reduce the manufacture cost.

In the embodiments of the present disclosure, for the other steps of the method, the process parameters in the steps and the structure of the resultant TFT, it may refer to those as shown in FIGS. 1 to 5, and thus will not be particularly defined herein.

According to the methods as shown in FIGS. 1 to 5 and FIGS. 6 to 9, the source electrode and the drain electrode of the TFT are made of the transparent conductive photoresist, and as compared with the related art where the source electrode and the drain electrode are made of a metal material, it is able to omit a wet-etching process and a removing process during the formation of the source electrode and the drain electrode, thereby to prevent the active layer made of the metal oxide from being damaged by the water used in the wet-etching process and the removing process, and ensure the electrical properties of the TFT with the active layer made of the metal oxide. In addition, the source electrode and the drain electrode are transparent, so it is able to increase the aperture ratio of the pixel unit of the array substrate using the TFT, thereby to reduce the power consumption of the backlight source of the display device using the TFT.

The present disclosure further provides in some embodiments a method for manufacturing an array substrate which includes a step of forming the TFT in the embodiment of FIGS. 1 to 5 or the embodiment of FIGS. 6 to 9 on the base.

In a possible embodiment of the present disclosure, the method may further include forming a data line using the transparent conductive photoresist. The data line is formed together with the source electrode and the drain electrode of the TFT through a single patterning process.

According to the method for manufacturing the array substrate in the embodiments of the present disclosure, the data line and the source electrode and the drain electrode of the TFT are formed using the transparent conductive photoresist. As compared with the related art where the data line, the source electrode and the drain electrode are made of a metal material, it is able to omit a wet-etching process and a removing process during the manufacture of the data line, the source electrode and the drain electrode, thereby to prevent the active layer made of the metal oxide from being damaged by the water used in the wet-etching process and the removing process, and ensure the electrical properties of the TFT with the active layer made of the metal oxide and improve the electrical quality of the array substrate using the TFT. In addition, the data line, the source electrode and the drain electrode are transparent, so it is able to increase the aperture ratio of the pixel unit of the array substrate, thereby to reduce the power consumption of the backlight source of the display device using the array substrate.

Figure 10:
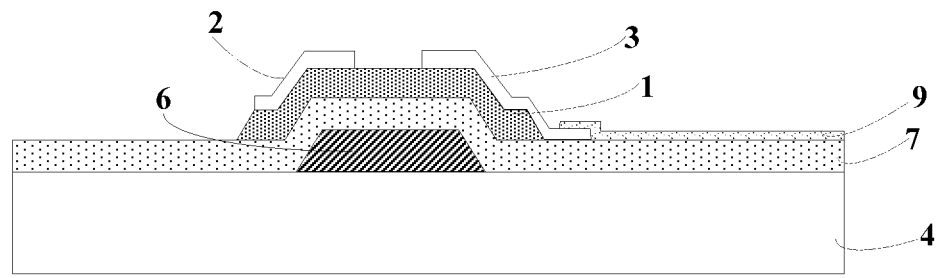
FIG. 10 is a schematic view showing the formation of a pixel electrode according to some embodiments of the present disclosure.
Figure 11:
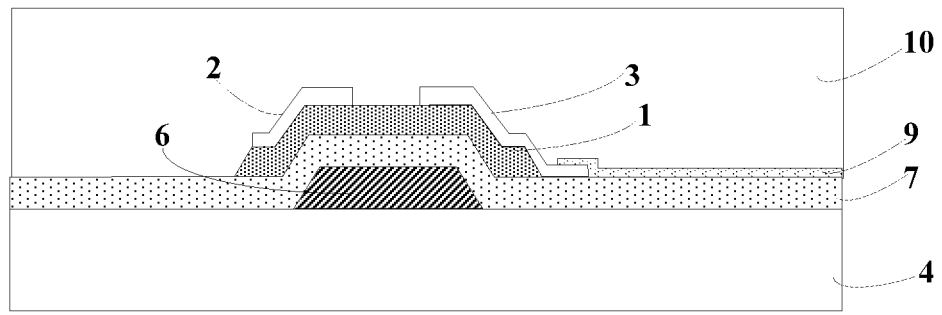
FIG. 11 is a schematic view showing the formation of a passivation layer according to some embodiments of the present disclosure.
Figure 12:
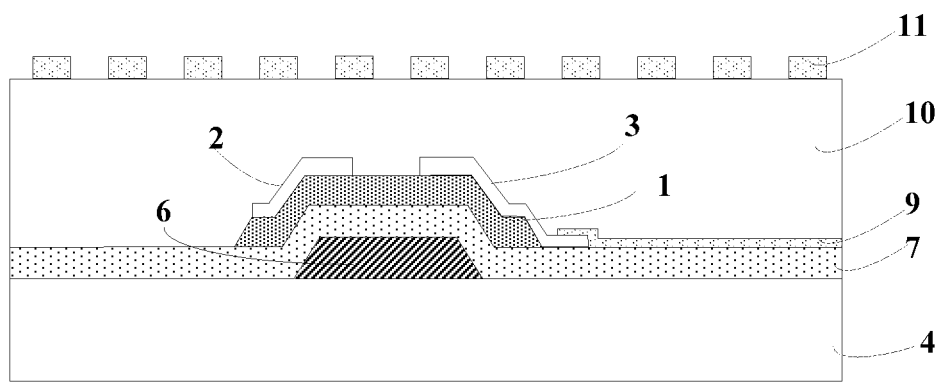
FIG. 12 is a schematic view showing the formation of a common electrode according to some embodiments of the present disclosure.

In a possible embodiment of the present disclosure, as shown in FIGS. 10 to 12, the method may further include a step of forming a pixel electrode 9, a passivation layer 10 and a common electrode 11 sequentially on the base 1 with the TFT through a patterning process. To be specific (by taking the array substrate including the bottom-gate TFT as an example), this step may include the following steps.

Step S30: depositing a transparent conductive layer onto the base 4 with the pattern of the source electrode 2 and the drain electrode 3 through magnetron sputtering, and forming the transparent pixel electrode 9 through a single patterning process (as shown in FIG. 10). The transparent pixel electrode 9 may have a thickness within the range of 40 nm to 80 nm, and the transparent pixel electrode 9 may be made of a transparent metal oxide such as ITO or IZO.

Step S31: depositing a passivation layer film onto the base 4 acquired after step S30 through plasma enhanced chemical vapor deposition (PECVD), and forming a pattern of the passivation layer 10 through a patterning process (as shown in FIG. 11). The passivation layer 10 may have a thickness within the range of 200 nm to 600 nm, and the passivation layer 10 may be of a single-layered structure made of silicon nitride, a double-layered structure consisting of a silicon nitride layer and a silicon oxide layer, or a triple-layered structure consisting of a silicon nitride layer, a silicon oxynitride layer and a silicon oxide layer.

Step S32: depositing a transparent conductive layer onto the base 4 acquired after step S31 through magnetron sputtering, and forming the transparent common electrode 11 through a single patterning process (as shown in FIG. 12). The transparent common electrode 11 may have a thickness within the range of 40 nm to 80 nm, and the transparent common electrode 11 may be made of a transparent metal oxide such as ITO or IZO.

Figure 13:
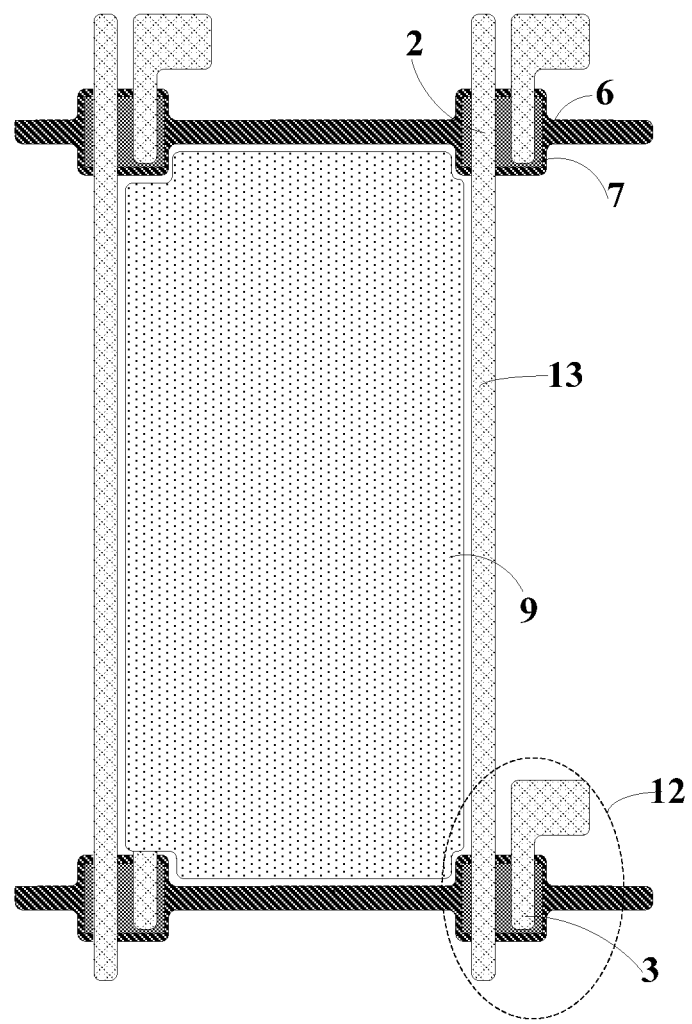
FIG. 13 is a topical, top view of an array substrate according to some embodiments of the present disclosure.

Based on an identical inventive concept, the present disclosure further provides in some embodiments an array substrate manufactured by the above-mentioned method, as shown in FIG. 13. The array substrate may include the TFT 12 in the embodiment of FIGS. 1 to 5 or the embodiment of FIGS. 6 to 9.

In a possible embodiment of the present disclosure, the array substrate may further include a data line 13 arranged at a layer, and made of a material, identical to the source electrode 2 and the drain electrode 3 of the TFT 12.

In a possible embodiment of the present disclosure, the array substrate may further include the pixel electrode 9, the passivation layer and the common electrode (not shown in FIG. 13). The pixel electrode 9 may be arranged above, and connected to, the drain electrode 3, and the passivation layer and the common electrode may be sequentially arranged above the pixel electrode 9.

According to the array substrate and the manufacturing method thereof in the embodiment of FIGS. 10-13 of the present disclosure, the data line and the source electrode and the drain electrode of the TFT are formed using the transparent conductive photoresist. As compared with the related art where the data line, the source electrode and the drain electrode are made of a metal material, it is able to omit a wet-etching process and a removing process during the manufacture of the data line, the source electrode and the drain electrode, thereby to prevent the active layer made of the metal oxide from being damaged by the water used in the wet-etching process and the removing process, and ensure the electrical properties of the TFT with the active layer made of the metal oxide and improve the electrical quality of the array substrate using the TFT. In addition, the data line, the source electrode and the drain electrode are transparent, so it is able to increase the aperture ratio of the pixel unit of the array substrate, thereby to reduce the power consumption of the backlight source of the display device using the array substrate.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing a thin film transistor, comprising:
   forming an active layer film on a base; and
   forming a source electrode and a drain electrode of the thin film transistor using conductive photoresist, to enable that the source electrode and the drain electrode are made of the conductive photoresist.

2. The method according to claim 1, wherein subsequent to the step of forming the active layer film and prior to the step of forming the source electrode and the drain electrode, the method further comprises:
   forming a pattern of an active layer on the base through a patterning process.

3. The method according to claim 2, wherein the step of forming the source electrode and the drain electrode of the thin film transistor using the conductive photoresist comprises:
   applying a conductive photoresist film onto the base on which the pattern of the active layer has been formed;
   pre-curing the conductive photoresist film;
   exposing and developing the conductive photoresist film, to form a pattern comprising the source electrode and the drain electrode; and
   post-curing the source electrode and the drain electrode.

4. The method according to claim 3, wherein the step of applying the conductive photoresist film comprises:
   applying the conductive photoresist film onto the base in a slit-coating manner or a spin-coating manner, to form the conductive photoresist film with a thickness of 0.2 µm to 2.0 µm on the base.

5. The method according to claim 3, wherein
   the conductive photoresist film is pre-cured at a temperature of 100° C. to 110° C. for 50 seconds to 80 seconds.

6. The method according to claim 3, wherein
the conductive photoresist is transparent conductive photoresist, and the conductive photoresist film is transparent conductive photoresist film.

7. The method according to claim 3, wherein
the source electrode and the drain electrode are post-cured at a temperature of 110° C. to 120° C. for 50 seconds to 80 seconds.

8. The method according to claim 7, wherein
the source electrode and the drain electrode are post-cured at a temperature of 120° C. for 60 seconds.

9. The method according to claim 2, wherein subsequent to or prior to the steps of forming the active layer, the source electrode and the drain electrode, the method further comprises:
forming a gate electrode and a gate insulation layer of the thin film transistor sequentially on the base.

10. The method according to claim 1, wherein the step of forming the source electrode and the drain electrode of the thin film transistor using the conductive photoresist comprises:
applying a conductive photoresist film onto the base on which the active layer film has been formed;
pre-curing the conductive photoresist film;
subjecting the conductive photoresist film to a patterning process, to remove a portion of the conductive photoresist film at a region other than a region corresponding to a pattern of the active layer, partially reserve a portion of the conductive photoresist film at a region corresponding to a channel in the active layer, and reserve a portion of the conductive photoresist film at a region corresponding to the pattern of the source electrode and the drain electrode;
forming the pattern of the active layer through a wet-etching process; and
removing the portion of the conductive photoresist film at the region corresponding to the channel in the active layer, and thinning the portion of the conductive photoresist film at the region corresponding to the pattern of the source electrode and the drain electrode through a dry-etching process, to form the pattern of the source electrode and the drain electrode.

11. The method according to claim 1, wherein the conductive photoresist comprises:
a conductive medium, a film-forming resin, a photosensitizer, a solvent and a supplement.

12. The method according to claim 11, wherein
the conductive medium is made of metal conductive particles or alloy conductive particles having resistivity smaller than $10*10^{-8}$ $\Omega\cdot$m, or graphene;
the film-forming resin is thermoplastic resin; and
the photosensitizer is made of an aromatic ketone derivative or a benzoin ether derivative.

13. The method according to claim 1, wherein
the active layer is made of a polycrystalline metal oxide semiconductor material or an amorphous metal oxide semiconductor material.

14. A method for manufacturing an array substrate, comprising:
forming a thin film transistor on a base,
wherein the step of forming the thin film transistor on the base comprises: forming an active layer film on the base; and forming a source electrode and a drain electrode of the thin film transistor using conductive photoresist, to enable that the source electrode and the drain electrode are made of the conductive photoresist.

15. The method according to claim 14, further comprising:
forming a data line using the conductive photoresist, the data line being formed together with a source electrode and a drain electrode of the thin film transistor through a single patterning process; and
forming, through patterning processes, a pixel electrode, a passivation layer and a common electrode sequentially on the base on which the thin film transistor has been formed.

16. The method according to claim 14, wherein
the conductive photoresist is transparent conductive photoresist.

17. A thin film transistor, comprising:
an active layer;
a source electrode; and
a drain electrode,
wherein the source electrode and the drain electrode are arranged above the active layer and made of a conductive photoresist.

18. The thin film transistor according to claim 17, further comprising:
a gate electrode; and
a gate insulation layer,
wherein the gate electrode is arranged between a base and the active layer, and the gate insulation layer is arranged between the gate electrode and the active layer; or
the gate insulation layer and the gate electrode are sequentially arranged above the source electrode and the drain electrode.

19. The thin film transistor according to claim 17, wherein
the source electrode and the drain electrode are arranged at an identical layer and at two sides of the active layer respectively.

20. The thin film transistor according to claim 17, wherein the conductive photoresist is transparent conductive photoresist.

* * * * *